United States Patent
Lee et al.

(10) Patent No.: US 7,675,056 B2
(45) Date of Patent: Mar. 9, 2010

(54) GERMANIUM PHOTOTRANSISTOR WITH FLOATING BODY

(75) Inventors: Jong-Jan Lee, Camas, WA (US); Sheng Teng Hsu, Camas, WA (US); Jer-Shen Maa, Vancouver, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 117 days.

(21) Appl. No.: 11/891,574

(22) Filed: Aug. 10, 2007

(65) Prior Publication Data
US 2007/0295953 A1 Dec. 27, 2007

Related U.S. Application Data

(62) Division of application No. 11/174,035, filed on Jul. 1, 2005, now Pat. No. 7,271,023.

(51) Int. Cl.
| H01L 29/06 | (2006.01) |
| H01L 31/072 | (2006.01) |
| H01L 31/109 | (2006.01) |
| H01L 31/0328 | (2006.01) |
| H01L 31/062 | (2006.01) |
| H01L 31/113 | (2006.01) |
| H01L 31/0232 | (2006.01) |

(52) U.S. Cl. ............... 257/20; 257/292; 257/436

(58) Field of Classification Search ............. 257/19–21, 257/291–294, 431–448, E31.073, E31.127, 257/E27.133
See application file for complete search history.

(56) References Cited

U.S. PATENT DOCUMENTS

| 7,338,886 B2 * | 3/2008 | Liu et al. ............. 438/483 |
| 2006/0237746 A1 * | 10/2006 | Orlowski et al. ............. 257/192 |

* cited by examiner

*Primary Examiner*—Cuong Q Nguyen
(74) *Attorney, Agent, or Firm*—Law Offices of Gerald Maliszewski; Gerald Maliszewski

(57) ABSTRACT

A floating body germanium (Ge) phototransistor and associated fabrication process are presented. The method includes: providing a silicon (Si) substrate; selectively forming an insulator layer overlying the Si substrate; forming an epitaxial Ge layer overlying the insulator layer using a liquid phase epitaxy (LPE) process; forming a channel region in the Ge layer; forming a gate dielectric, gate electrode, and gate spacers overlying the channel region; and, forming source/drain regions in the Ge layer. The LPE process involves encapsulating the Ge with materials having a melting temperature greater than a first temperature, and melting the Ge using a temperature lower than the first temperature. The LPE process includes: forming a dielectric layer overlying deposited Ge; melting the Ge; and, in response to cooling the Ge, laterally propagating an epitaxial growth front into the Ge from an underlying Si substrate surface.

6 Claims, 4 Drawing Sheets

US 7,675,056 B2

GERMANIUM PHOTOTRANSISTOR WITH FLOATING BODY

RELATED APPLICATIONS

This application is a Divisional of a patent application entitled, FLOATING BODY GERMANIUM PHOTOTRANSISTOR, invented by Lee et al., Ser. No. 11/174,035, filed Jul. 1, 2005 now U.S. Pat. No. 7,271,203. This application is incorporated herein by reference.

BACKGROUND OF THE INVENTION

1. Field of the Invention

This invention generally relates to integrated circuit (IC) fabrication and, more particularly, to a germanium (Ge) phototransistor and associated fabrication process that capitalizes on the floating body effect of a device insulated from an underlying substrate.

2. Description of the Related Art

In a co-pending application entitled METHOD OF EPITAXIAL GROWTH OF GERMANIUM PHOTODETECTOR FOR CMOS IMAGER, Lee et al., Ser. No. 11/069,424, filed Feb. 28, 2005, a method for growing single crystalline Ge film by liquid phase epitaxy is presented, along with a means of fabricating a PIN photo detector for infrared photon detection. However, it is noted that the interface between Ge single crystal and the bottom dielectric layer ($Si_3N_4$) is not perfect. This interface may potentially cause leakage current in the diode. This interface is likely the result of the Ge PIN diode using the entire Ge film, so that the bottom interface deteriorates the electrical performance.

It would be advantageous if an improved interface could be created between the epitaxial layer of a Ge active device and the underlying substrate insulator.

It would be advantage if a Ge device could be fabricated so as to minimize the effect of the substrate interface.

It would be advantageous if the epitaxial layer of a Ge active device could be more effectively insulated from an underlying Si substrate.

SUMMARY OF THE INVENTION

The present invention describes a method for fabricating a floating body Ge MOS transistor for infrared (IR) photo detection. The floating body Ge MOS transistor minimizes the contribution of the imperfect bottom interface to the device's electrical characteristics.

Accordingly, a method is provided for fabrication a floating body Ge phototransistor. The method comprises: providing a silicon (Si) substrate; selectively forming an insulator layer overlying the Si substrate; forming an epitaxial Ge layer overlying the insulator layer using a liquid phase epitaxy (LPE) process; forming a channel region in the Ge layer; forming a gate dielectric, gate electrode, and gate spacers overlying the channel region; and, forming source/drain regions in the Ge layer.

The LPE process involves encapsulating the Ge with materials having a melting temperature greater than a first temperature, and melting the Ge using a temperature lower than the first temperature. The selective formation of the insulator layer includes forming the insulator over a first surface of the Si substrate, and exposing a second surface of the Si substrate. Then, the LPE process includes: depositing Ge overlying the insulator layer and the Si substrate second surface; forming a dielectric layer overlying the Ge; melting the Ge; and, in response to cooling the Ge, laterally propagating an epitaxial growth front into the Ge from the Si substrate second surface.

Additional details of the above-described method and floating body Ge phototransistor are provided below.

DETAILED DESCRIPTION

Figure 1:
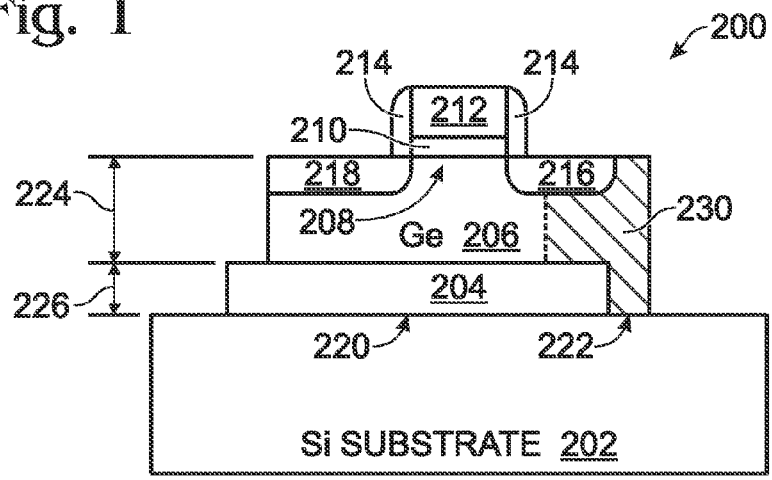
FIG. 1 is a partial cross-sectional view of a floating body germanium (Ge) phototransistor.

FIG. 1 is a partial cross-sectional view of a floating body germanium (Ge) phototransistor. The phototransistor 200 comprises a silicon (Si) substrate 202 and an insulator layer 204 overlying the Si substrate 202. An epitaxial Ge layer 206 overlies the insulator layer 204. A channel region 208 is formed in the Ge layer 206. A gate dielectric 210, gate electrode 212, and gate spacers 214 overlie the channel region 208. A source 216 and a drain 218 are formed in the Ge layer 206.

More specifically, the insulator layer 204 overlies a first surface 220 of the Si substrate 202, exposing a second surface 222 of the Si substrate. The epitaxial Ge layer 206 is formed overlying the insulator layer 204 and the Si substrate second surface 222. Typically, the epitaxial Ge layer 206 has a thickness 224 (above the insulator 204) in the range of 20 to 1000 nm. The insulator layer 204 typically has a thickness 226 in the range of 10 to 500 nanometers (nm).

In one aspect, the gate dielectric 210, gate electrode 212, and gate spacers 214 are formed from wide bandgap materials. The use of wide bandgap materials permits the entry of light (IR) from the "top" direction into the Ge layer 206. Alternately, only some of these regions are made from wide bandgap materials. As another alternative, narrow bandgap materials, and/or a metal gate are used, and IR light enters the Ge layer from the side or bottom directions.

Some wide bandgap materials that may be used for the gate dielectric 210 include $SiO_2$, $GeO_2$, $Al_2O_3$, $HfO_2$, $ZrO_2$, $TiO_2$, $Ta_2O_5$, and combinations of the above-mentioned materials. Wide bandgap gate electrode materials include polycrystalline Ge, polycrystalline SiGe, and polysilicon. Some wide bandgap gate spacer materials are $SiO_2$ and $Si_3N_4$. However, this is not an exhaustive list of wide bandgap materials. Further, as mentioned above, wide bandgap material need not be used. As used herein, a wide bandgap material has a bandgap of greater than about 1.1 eV, and readily permits the penetration of light with a wavelength between 1 and 1.6 micrometers. This is the wavelength of light is absorbed by Ge. 1.1 eV is the bandgap of Si. PolySiGe and polyGe have slightly narrower bandgaps than 1.1 eV, which permits at least the partial penetration of IR.

In one aspect, the epitaxial Ge layer 206 includes a deep source region 230 (shown as cross-hatched) between the source 216 and the Si substrate second surface 222. The deep source region 230 is implanted with ions, typically the same ions used to dope the source and drain regions. The ion implantation may extend into the Si substrate 202. This ion doping acts to electrically isolate the Ge layer 206 from the Si substrate second surface 222, as is explained in more detail below. This deep source region 230 may also act as an interconnect to devices (not shown) formed on the bottom of Si substrate 202. If device 200 is a NMOS transistor for example, the Ge layer 206 is generally p-doped, while the source 216, drain 218, and deep source region 230 are n-doped. So, the p-doped Ge layer 206 is isolated from the Si substrate by the intervening n-doped Ge region 230. With respect to a PMOS device, the source 216, drain 218, and deep source region 230 are p-doped, while the rest of the Ge layer 206 is n-doped.

Figure 2:
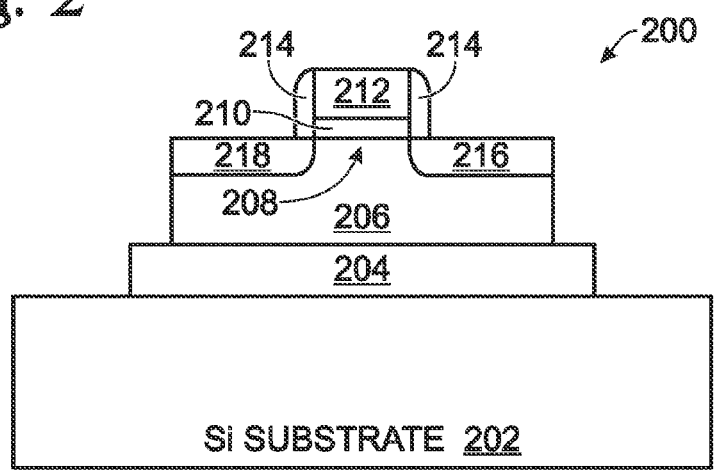
FIG. 2 is a partial cross-sectional view of an alternate aspect of the Ge phototransistor of FIG. 1.

FIG. 2 is a partial cross-sectional view of an alternate aspect of the Ge phototransistor of FIG. 1. In this aspect, the epitaxial Ge layer 206 is physically isolated from the Si substrate 202. Because of the physical isolation (the Ge layer 206 does not directly overlie Si substrate 202), the additional doping step used to form the deep source region (described above in FIG. 1) need not be performed.

Functional Description

This invention describes a Ge MOSFET device on an insulator structure that takes advantage of the floating body effect for improved amplification of a photodetector signal. The Ge epitaxial film is formed by liquid phase epitaxial regrowth. However, the floating body effect associated with this Ge MOS phototransistor is also applicable to any device fabricated on germanium-on-insulator (GeOI) wafers.

The floating body model for an SOI device depicts a body that is capacitively coupled, through separate capacitors, to the gate, drain, source, and substrate. A more complex model envisions a parasitic bipolar transistor with a base connected to the body, an emitter and collector connected to the source and drain, and a parallel connected back transistor with a gate connected to the substrate.

Figure 3:
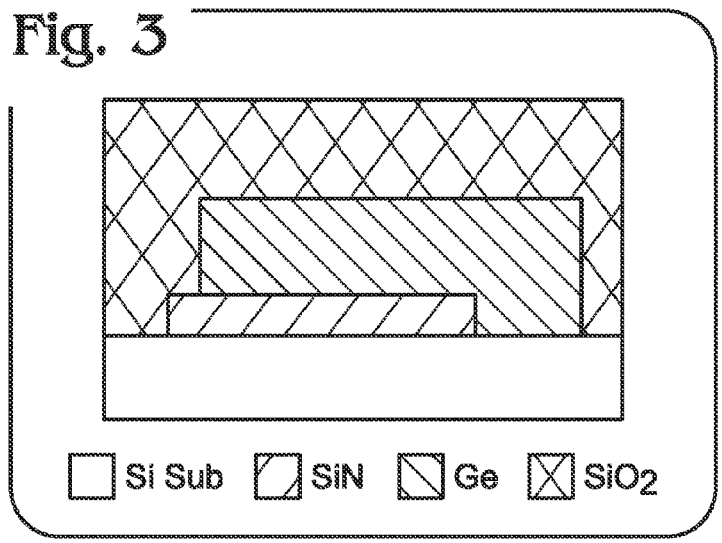
FIG. 3 is a partial cross-sectional view of a Ge phototransistor fabrication step.

FIG. 3 is a partial cross-sectional view of a Ge phototransistor fabrication step. Silicon nitride is used as an insulator layer. However, other insulator materials can also be used. The insulator is deposited on a Si wafer and then patterned. The silicon nitride layer thickness is between 10 nm to 500 nm. Ge is then deposited non-selectively. The Ge thickness is between 20 nm to 1000 nm. The Ge deposition method can be CVD (chemical vapor deposition), PVD (physical vapor deposition), MBE (Molecule Beam Epitaxy), or any other suitable thin film deposition method. Next, the Ge film is patterned and etched into desired features. These features must include a small area of Ge directly on top of the Si substrate. This area works as a seed window for the Ge epitaxal process. Then, a conformal dielectric layer (20 nm to 1000 nm) is deposited to encapsulate the Ge film. Rapid thermal annealing (RTA) is used to heat up the wafer and melt the Ge film. For example, silicon oxide or silicon nitride can be used as the dielectric layer. The melting temperature for crystalline Ge is 938° C., so the RTA temperature is between 920° C. to 1000° C. During this anneal, the Ge film melts, and the dielectric insulators encapsulating the Ge act as microcrucibles, keeping the Ge liquid from flowing randomly. The Si substrate, the underlying insulator and overlying dielectric remain solid. The wafer is then cooled down naturally. While the Ge liquid is cooling down, liquid phase epitaxy (LPE) occurs, with the growth front starting from the Si/Ge interface in the seeding windows, propagating laterally. Finally, single crystalline Ge is formed with defects concentrated and terminated at the seeding window.

Figure 4:
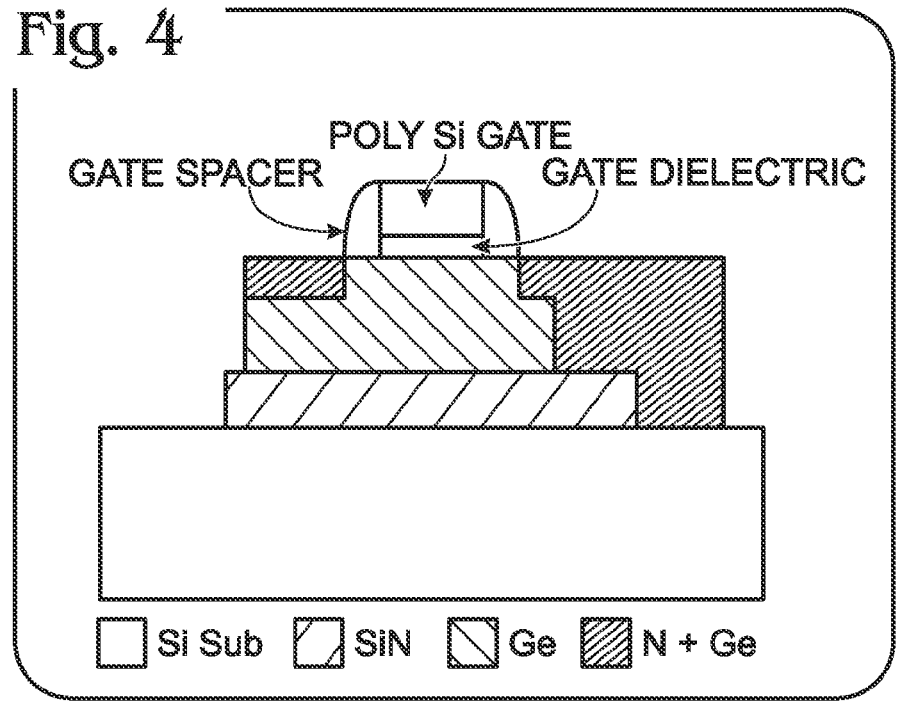
FIG. 4 is a partial cross-sectional view of the Ge phototransistor of FIG. 3, following the LPE process.

FIG. 4 is a partial cross-sectional view of the Ge phototransistor of FIG. 3, following the LPE process. After the Ge LPE process is completed, the overlying dielectric layer is selectively removed. For example, if silicon oxide is used as the dielectric, it can be removed in an HF-containing solution. A Ge MOS transistor is fabricated on the Ge single crystal epitaxial layer. The fabrication process steps are similar to any state-of-art Si CMOS process: channel ion implantation, gate dielectric deposition, gate material deposition, gate formation, gate spacer formation, and then source/drain formation. There are several steps in the process that may be further detailed.

(A) The Ge MOS transistor can be either NMOS or PMOS. An NMOS transistor is shown and described.

(B) The lightly doped drain (LDD) process that generally occurs prior to the spacer formation may be skipped. Eliminating of the LDD regions effectively increases the light absorption area.

(C) The gate dielectric, gate, and spacers are typically wide bandgap materials that do not absorb the infrared photons. The gate dielectrics can be $SiO_2$, $GeO_2$, $Al_2O_3$, $HfO_2$, $ZrO_2$, $TiO_2$, $Ta_2O_5$, or any kind of combination. The gate can be polysilicon and the spacers can be $SiO_2$ or $Si_3N_4$.

(D) A self aligned source/drain ion implantation, with As or P ions, is used. A shallow ion implantation is preferred to keep the S/D-to-body junction away from the $Ge/Si_3N_4$ interface.

(E) An additional ion implantation (using N+ ions such as As or P) on the source side may be performed to electrically isolate the Ge body. If the Si substrate is being used to fabricate bottom devices, this deep implanted N+ Ge can be used as a local interconnection between the Ge device and Si bottom device. If a PMOS device was being made, then P+ ion implantations, using a material such as B, are performed.

Figure 5:
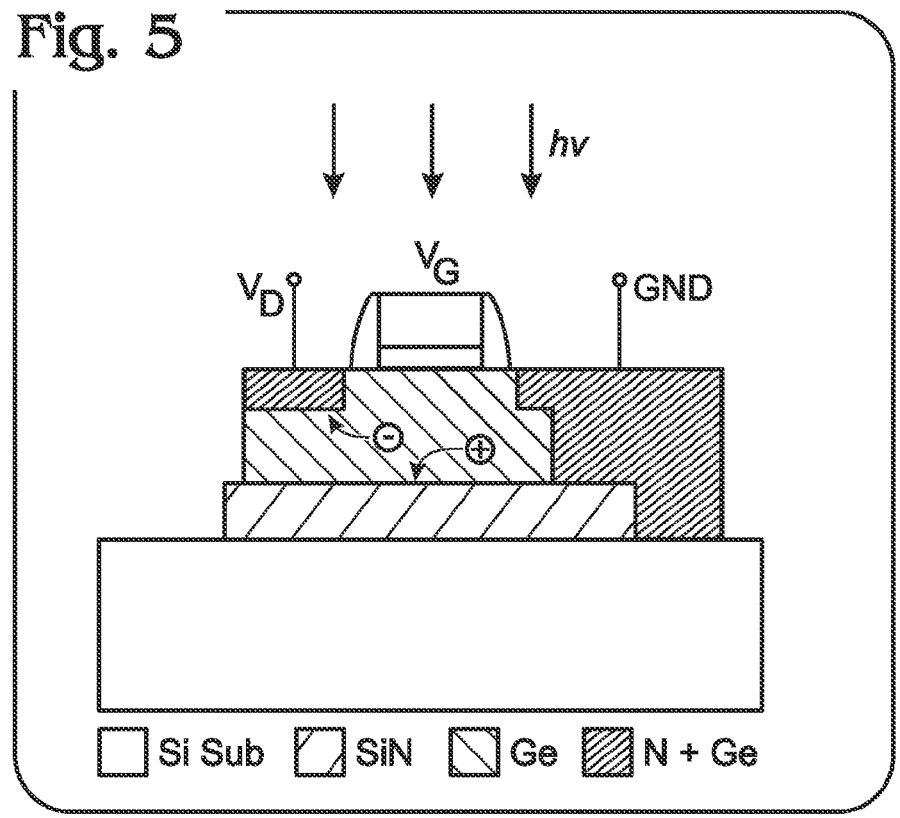
FIG. 5 is a partial cross-sectional view of the Ge phototransistor of FIG. 4, depicting device operation.

FIG. 5 is a partial cross-sectional view of the Ge phototransistor of FIG. 4, depicting device operation. The IR light, with a wavelength of 700 nm to 2000 nm, illuminates the Ge NMOS device. A positive voltage bias is applied to the gate and drain. The IR photons penetrate the passivation layer ($SiO_2$ and $Si_3N_4$), polysilicon gate, and gate dielectric, and are absorbed in the Ge layer. Electron and hole pairs are generated. The electrons flow to the drain while the holes accumulate in the Ge body. Ge body potential is then increased, which in turn reduces the source-to-body potential, and increases the drain current. With respect to silicon-on-insulator (SOI) devices, this phenomenon is well known as the floating body effect. In the general case for SOI devices, the electron-hole pairs are generated by impact ionization near the drain junction. In the present invention Ge phototransistor, the electron-hole pairs are generated by photon absorption in the Ge layer.

Figure 6:
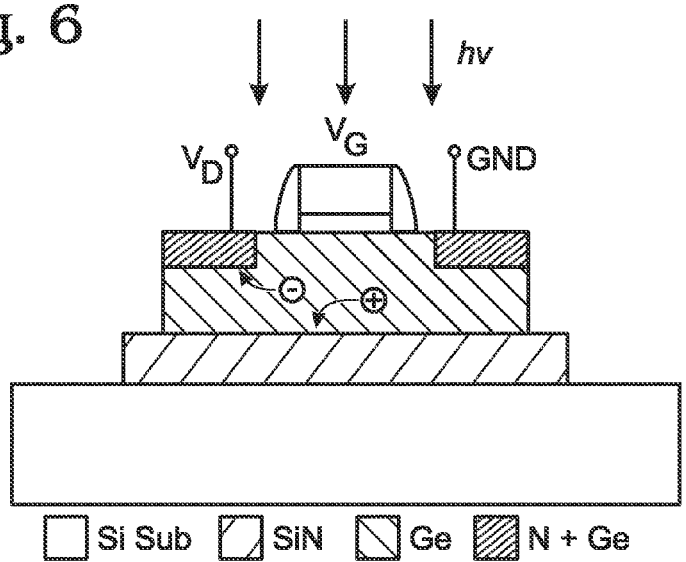
FIG. 6 is a partial cross-sectional view of a variation in the Ge phototransistor, depicting device operation.

FIG. 6 is a partial cross-sectional view of a variation in the Ge phototransistor, depicting device operation. In this alternative device structure, the Ge NMOS phototransistor is both physically and electrically isolated from the Si substrate. The Ge-to-Si seed window is etched away after the LPE process. The process step for the additional N+ deep implantation on the source side (FIG. 5) is not necessary for this structure. The device operations mechanism is similar to that described for FIG. 5.

Figure 7:
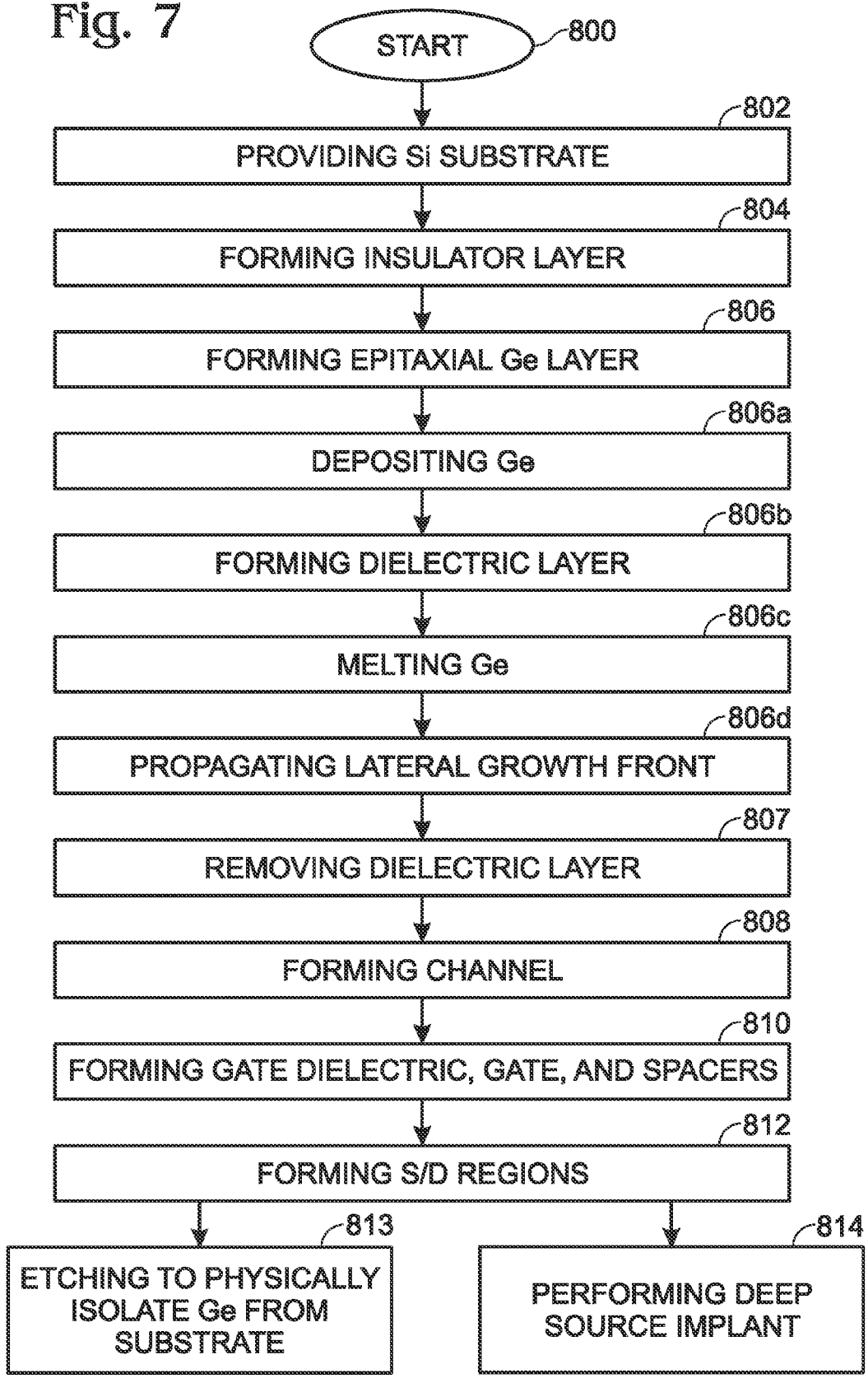
FIG. 7 is a flowchart illustrating a method for fabrication a floating body Ge phototransistor.

FIG. 7 is a flowchart illustrating a method for fabrication a floating body Ge phototransistor. Although the method is depicted as a sequence of numbered steps for clarity, the numbering does not necessarily dictate the order of the steps.

It should be understood that some of these steps may be skipped, performed in parallel, or performed without the requirement of maintaining a strict order of sequence. The method starts at Step 800.

Step 802 provides a Si substrate. Step 804 selectively forms an insulator layer overlying the Si substrate. In one aspect, Step 804 forms an insulator layer having a thickness in the range of 10 to 500 nm. Step 806 forms an epitaxial Ge layer overlying the insulator layer. Step 808 forms a channel region in the Ge layer. Step 810 forms a gate dielectric, gate electrode, and gate spacers overlying the channel region. Step 812 forms source/drain regions in the Ge layer. Steps 808, 810 and 812 are entirely conventional CMOS fabrication processes. However, the gate dielectric, gate electrode, and gate spacers formed in Step 810 may be wide bandgap materials. In one aspect, Step 812 forms source/drain regions in the Ge layer by performing a shallow ion self-aligned source/drain implantation in the Ge adjacent the gate spacers.

As mentioned earlier, forming the epitaxial Ge layer overlying the insulator layer in Step 806 may includes performing a LPE process on deposited Ge as follows: encapsulating the Ge with materials having a melting temperature greater than a first temperature; and, melting the Ge using a second temperature, less than the first temperature. However, it should be noted that there are other well-known means for forming a GeOI substrate, and the present invention is not necessarily limited to just the LPE process.

In one aspect, selectively forming the insulator layer overlying the Si substrate in Step 804 includes forming the insulator over a first surface of the Si substrate, exposing a second surface of the Si substrate. Then, performing the LPE process on deposited Ge in Step 806 includes substeps. Step 806a deposits Ge overlying the insulator layer and the Si substrate second surface. Step 806b forms a dielectric layer overlying the Ge, having a higher melting point than Ge. For example, the material may be silicon oxide. Step 806c melts the Ge, and Step 806d laterally propagates an epitaxial growth front into the Ge from the Si substrate second surface in response to cooling the Ge.

In one aspect, melting the Ge in Step 806c includes heating the Si substrate to a temperature in the range of 920 and 1000° C., for a time duration in the range of 0 to 10 seconds. The duration "0 seconds" means that the substrate is cooled immediately upon reaching the target temperature. In another aspect, depositing Ge in Step 806a includes depositing Ge using a process such as CVD, PVD, or MBE. However, the method is not limited to any particular deposition process. In a different aspect, Step 806a deposits Ge to a thickness in the range of 20 to 1000 nm.

In one aspect, Step 807 removes the dielectric layer overlying the Ge. With respect to Step 808, the gate dielectric may be $SiO_2$, $GeO_2$, $Al_2O_3$, $HfO_2$, $ZrO_2$, $TiO_2$, $Ta_2O_5$, or combinations of the above-mentioned materials. The gate electrode may be polycrystalline Ge, polycrystalline SiGe, or polysilicon. The gate spacers adjacent the gate electrode may be $SiO_2$ or $Si_3N_4$. Other, narrow bandgap, materials may also be used.

In one aspect, forming source/drain regions in the Ge layer (Step 812) includes forming the source approximately overlying the Si substrate second surface (see FIGS. 1 and 5). Then, Step 814 performs an additional ion implantation into a deep source region between the source and the Ge layer overlying the Si substrate second surface, to electrically isolate the channel in the Ge layer from the Si substrate. In another aspect, Step 801 (not shown), prior to forming the epitaxial Ge layer overlying the insulator layer, fabricates a bottom device on the Si substrate. Then, performing the additional ion implantation in Step 814 includes using the deep source region as an electrical interconnect to the bottom device.

As an alternative to Step 814, Step 813 etches the Ge layer overlying the Si substrate second surface, physically isolating the Ge layer from the Si substrate second surface (see FIGS. 2 and 6).

Figure 8:
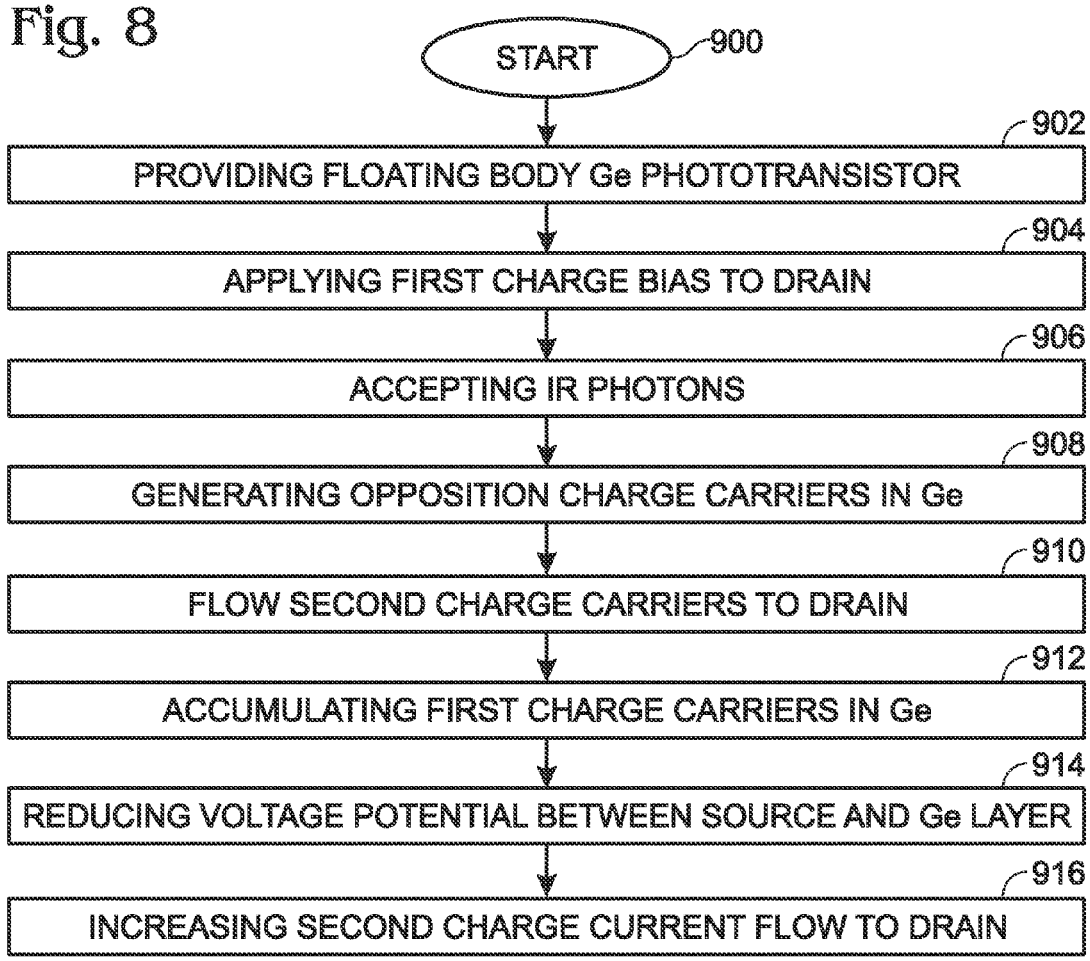
FIG. 8 is a flowchart illustrating a method for generating infrared (IR) phototransistor current.

FIG. 8 is a flowchart illustrating a method for generating infrared (IR) phototransistor current. The method begins at Step 900. Step 902 provides a floating body Ge phototransistor with a Si substrate, an insulator layer overlying the Si substrate, an epitaxial Ge layer overlying the insulator layer, a channel region in the Ge layer, a gate dielectric, gate electrode, and gate spacers overlying the channel region, and source/drain regions in the Ge layer. Step 904 applies a first charge bias to the drain. In the case of an NMOS device, a positive voltage is applied to the drain and gate. In the case of a PMOS device, a negative voltage is applied to the drain and gate.

Step 906 accepts IR wavelength photons into the Ge layer. Step 908 generates opposite charge carriers (see FIGS. 5 and 6). Step 910 flows second charge carriers, opposite with respect to the first charge bias, from the Ge layer to the drain. In the case of an NMOS device, negative charge carriers (electrons) flow to the drain. In the case of a PMOS device, positive charge carriers (holes) flow to the drain. Step 912 accumulates first charge carriers, opposite with respect to the second charge carriers, in the Ge layer. Step 914 reduces the voltage potential between the source and the Ge layer in response to accumulating the first charge carriers. Step 916 increases the second charge carrier flow to the drain in response to reducing the potential between the source and Ge layer.

In one aspect, accepting IR wavelength photons in the Ge layer in Step 906 includes accepting wavelengths in the range between 700 and 2000 nm. In another aspect, providing the floating body Ge phototransistor in Step 902 includes providing a phototransistor with the gate dielectric, gate electrode, and gate spacers made from wide bandgap materials. Then, accepting IR wavelength photons in Step 906 includes accepting photons passing through the gate dielectric, gate electrode, and gate spacers, into the Ge layer.

An epitaxial Ge phototransistor and associated fabrication method have been presented. Specific process steps and materials have been used as examples to illustrate the invention. However, the invention is not limited to merely these examples. Other variations and embodiments of the invention will occur to those skilled in the art.

We claim:

1. A floating body germanium (Ge) phototransistor, the phototransistor comprising:
    a silicon (Si) substrate with a first surface and a second surface;
    an insulator layer overlying the Si substrate first surface, exposing the Si substrate second surface;
    an epitaxial Ge layer overlying the insulator layer and the Si substrate second surface;
    a channel region in the Ge layer;
    a gate dielectric, gate electrode, and gate spacers overlying the channel region; and,
    source/drain regions in the Ge layer.

2. The phototransistor of claim 1 wherein the epitaxial Ge layer has a thickness in the range of 20 to 1000 nm.

3. The phototransistor of claim 1 wherein the insulator layer has a thickness in the range of 10 to 500 nanometers (nm).

4. The phototransistor of claim 1 wherein the gate dielectric, gate electrode, and gate spacers are formed from wide bandgap materials.

5. The phototransistor of claim 4 wherein the gate dielectric is a material selected from the group including SiO2, GeO2, Al2O3, HfO2, ZrO2, TiO2, Ta2O5, and combinations of the above-mentioned materials;

wherein the gate electrode is a material selected from the group including polycrystalline Ge, polycrystalline SiGe, and polysilicon; and, wherein the gate spacers are a material selected from the group including SiO2 and Si3N4.

6. The phototransistor of claim 1 wherein the epitaxial Ge layer includes a deep source region between the source and the Si substrate second surface implanted with ions to electrically isolate the Ge layer from the Si substrate second surface.

* * * * *